(12) United States Patent
Lin et al.

(10) Patent No.: US 12,230,549 B2
(45) Date of Patent: Feb. 18, 2025

(54) THREE-DIMENSIONAL INTEGRATED CIRCUIT STRUCTURES AND METHODS OF FORMING THE SAME

(71) Applicant: Taiwan Semiconductor Manufacturing Company, Ltd., Hsinchu (TW)

(72) Inventors: Chia-Min Lin, Hsinchu (TW); Ching-Hua Hsieh, Hsinchu (TW); Chih-Wei Lin, Hsinchu County (TW); Sheng-Hsiang Chiu, Tainan (TW); Sheng-Feng Weng, Taichung (TW); Yao-Tong Lai, Yilan County (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 134 days.

(21) Appl. No.: 17/717,153

(22) Filed: Apr. 11, 2022

(65) Prior Publication Data

US 2022/0238407 A1    Jul. 28, 2022

Related U.S. Application Data

(63) Continuation of application No. 16/719,955, filed on Dec. 18, 2019, now Pat. No. 11,309,226.

(51) Int. Cl.
*H01L 23/31* (2006.01)
*H01L 21/56* (2006.01)
(Continued)

(52) U.S. Cl.
CPC ........ *H01L 23/3135* (2013.01); *H01L 21/563* (2013.01); *H01L 21/565* (2013.01); *H01L 23/3128* (2013.01); *H01L 23/49816* (2013.01); *H01L 23/49833* (2013.01); *H01L 24/16* (2013.01); *H01L 24/24* (2013.01);
(Continued)

(58) Field of Classification Search
None
See application file for complete search history.

(56) References Cited

U.S. PATENT DOCUMENTS

2006/0060636 A1\* 3/2006 Daves .................... H05K 3/303
228/180.22
2010/0309714 A1\* 12/2010 Meade ................. H10N 70/231
438/795
(Continued)

*Primary Examiner* — Jay C Chang
(74) *Attorney, Agent, or Firm* — JCIPRNET

(57) ABSTRACT

Three-dimensional integrated circuit (3DIC) structures and methods of forming the same are provided. A 3DIC structure includes a semiconductor package, a first package substrate, a molded underfill layer and a thermal interface material. The semiconductor package is disposed over and electrically connected to the first package substrate through a plurality of first bumps. The semiconductor package includes at least one semiconductor die and an encapsulation layer aside the semiconductor die. The molded underfill layer surrounds the plurality of first bumps and a sidewall of the semiconductor package, and has a substantially planar top surface. The CTE of the molded underfill layer is different from the CTE of the encapsulation layer of the semiconductor package. The thermal interface material is disposed over the semiconductor package.

20 Claims, 15 Drawing Sheets

100: 102,103,104
200: 202,203,204
10: 100,200,RDL,E

(51) Int. Cl.
    *H01L 23/00*          (2006.01)
    *H01L 23/498*       (2006.01)
    *H01L 25/16*         (2023.01)

(52) U.S. Cl.
    CPC .... *H01L 25/16* (2013.01); *H01L 2224/16225* (2013.01); *H01L 2224/24137* (2013.01)

(56) References Cited

U.S. PATENT DOCUMENTS

| | | | |
|---|---|---|---|
| 2013/0091693 A1* | 4/2013 | Campbell | H01L 23/473 29/890.03 |
| 2019/0051633 A1* | 2/2019 | Bhagavat | H01L 23/5385 |
| 2021/0020459 A1* | 1/2021 | Shah | H01L 21/566 |

* cited by examiner

THREE-DIMENSIONAL INTEGRATED CIRCUIT STRUCTURES AND METHODS OF FORMING THE SAME

CROSS-REFERENCE TO RELATED APPLICATION

This application is a continuation application of and claims the priority benefit of a prior application Ser. No. 16/719,955, filed on Dec. 18, 2019. The entirety of the above-mentioned patent application is hereby incorporated by reference herein and made a part of this specification.

BACKGROUND

In recent years, the semiconductor industry has experienced rapid growth due to continuous improvement in integration density of various electronic components, e.g., transistors, diodes, resistors, capacitors, etc. For the most part, this improvement in integration density has come from successive reductions in minimum feature size, which allows more components to be integrated into a given area.

These smaller electronic components also require smaller packages that occupy less area than previous packages. Examples of the type of packages for semiconductors include quad flat pack (QFP), pin grid array (PGA), ball grid array (BGA), flip chips (FC), three-dimensional integrated circuits (3DICs), wafer level packages (WLPs), and package on package (PoP) devices. Some 3DICs are prepared by placing chips over chips on a semiconductor wafer level. The 3DICs provide improved integration density and other advantages, such as faster speeds and higher bandwidth, because of the decreased length of interconnects between the stacked chips. However, there are many challenges related to 3DICs.

DETAILED DESCRIPTION

Figure 1A:
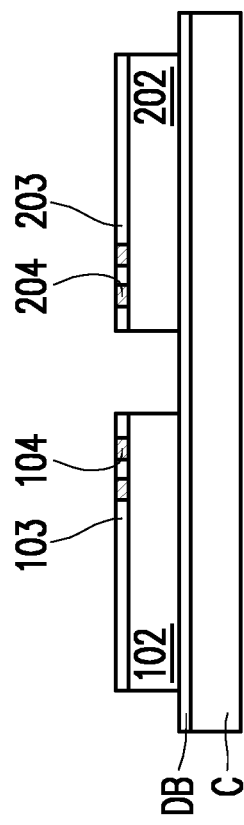
FIG. 1A to FIG. 1I are cross-sectional views of a method of forming a three-dimensional integrated circuit (3DIC) structure in accordance with some embodiments.

The following disclosure provides many different embodiments, or examples, for implementing different features of the provided subject matter. Specific examples of components and arrangements are described below for the purposes of conveying the present disclosure in a simplified manner. These are, of course, merely examples and are not intended to be limiting. For example, the formation of a second feature over or on a first feature in the description that follows may include embodiments in which the second and first features are formed in direct contact, and may also include embodiments in which additional features may be formed between the second and first features, such that the second and first features may not be in direct contact. In addition, the same reference numerals and/or letters may be used to refer to the same or similar parts in the various examples of the present disclosure. The repeated use of the reference numerals is for the purpose of simplicity and clarity and does not in itself dictate a relationship between the various embodiments and/or configurations discussed.

Further, spatially relative terms, such as "beneath", "below", "lower", "on", "over", "above", "upper" and the like, may be used herein to facilitate the description of one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1A to FIG. 1I are cross-sectional views of a method of forming a three-dimensional integrated circuit (3DIC) structure in accordance with some embodiments.

A semiconductor package is first provided. In some embodiments, the semiconductor package may include an application processor (AP), a System-On-Chip (SoC), a Chip-On-Wafer (CoW) package, an Integrated-Fan-Out (InFO) package, a Chip-On-Wafer-On-Substrate (CoWoS) package, another three-dimensional integrated circuit (3DIC) package, or a combination thereof. In some embodiments, the semiconductor package is a single and super large package including multiple semiconductor dies. The semiconductor dies may be arranged laterally and/or stacked vertically as needed. In alternative embodiments, the semiconductor package includes a plurality of individual packages, and each package includes at least one semiconductor die.

Figure 1B:
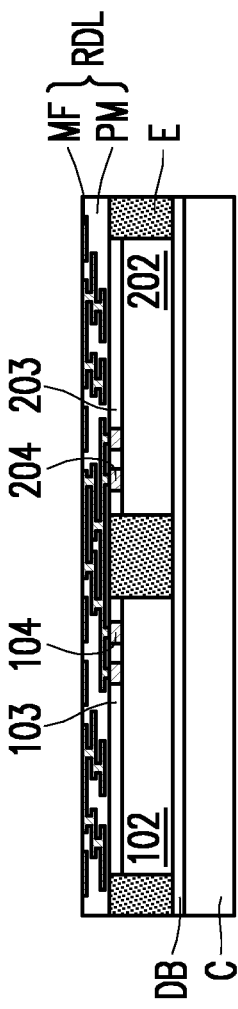
Figure 1C:
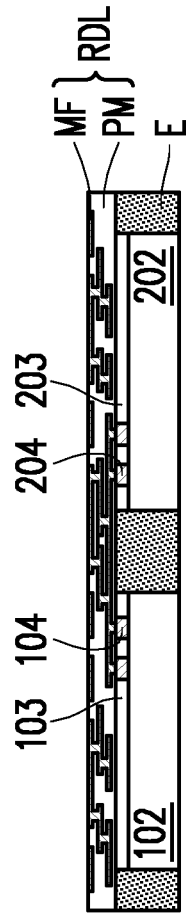

In some embodiments, the semiconductor package is formed by a method including the operations of FIG. 1A to FIG. 1C. As shown in FIG. 1A, a carrier C is provided with a debonding layer DB formed thereon. In some embodiments, the carrier C is a non-semiconductor material, such as a glass carrier, a ceramic carrier, an organic carrier, or the like. In some embodiments, the debonding layer DB includes a Ultra-Violet (UV) glue, a Light-to-Heat Conversion (LTHC) glue, or the like, although other types of adhesives may be used. The debonding layer DB is decomposable under the heat of light to thereby release the carrier C from the structure formed thereon.

Thereafter, semiconductor dies 100 and 200 are placed on the carrier C. In some embodiments, the debonding layer DB is formed between the carrier C and the backside of each of the semiconductor dies 100 and 200. In some embodiments, the semiconductor dies 100 and 200 are arranged side by side on the debonding layer DB. In some embodiments, an adhesive layer such as a die attach film (DAF) is formed between the debonding layer DB and each of the semiconductor dies 100 and 200.

In some embodiments, the semiconductor dies 100 and 200 may include integrated active devices, integrated passive devices or both. For example, the semiconductor dies 100 and 200 may include a wide variety of devices, such as processors, resistors, capacitors, transistors, diodes, fuse devices, logic devices, memory devices, discrete electronic devices, power devices, thermal dissipation devices, and/or the like. In some embodiments, one of the semiconductor dies 100 and 200 may be a dummy die. Herein, a dummy die indicates a non-operating die, a die configured for non-use, a die without devices therein or a die used only to electrically couple together two other dies in the die stack. The semiconductor dies 100 and 200 may have the same or different sizes and/or functions upon the design requirements.

In some embodiments, the semiconductor die 100 includes a substrate 102 and die connectors 104 over the substrate 102, and the semiconductor die 200 includes a substrate 202 and die connectors 204 over the substrate 204. Each of the substrates 102 and 202 may include bulk silicon, doped or undoped, or an active layer of a semiconductor-on-insulator (SOI) substrate. Device layers may be disposed in or on the substrates 102 and 104, respectively.

In some embodiments, the die connectors 104 and 204 are formed as the top portions of the semiconductor dies 100 and 200, respectively. The die connectors 104 and 204 protrude from the remaining portions or lower portions of the semiconductor dies 100 and 200. In some embodiments, the sides of the semiconductor dies 100 and 200 with the die connectors 104 and 204 are referred to as front sides. The die connectors 104 and 204 may include Cu, W, Ni, Sn, Ti, Au, an alloy or a combination thereof, and may be formed by a plating process. In some embodiments, the die connectors 104 and 204 are referred to as front-side connectors of the semiconductor dies 100 and 200.

In some embodiments, the semiconductor dies 100 and 200 further include protection layers 103 and 203 aside the die connectors 104 and 204, respectively. Specifically, the protection layers 103 and 203 are formed to fill gaps between the die connectors 104 and 204, respectively. In some embodiments, the protection layers 103 and 203 include a photo-sensitive material such as polybenzoxazole (PBO), polyimide, benzocyclobutene (BCB), a combination thereof, or the like, which may be easily patterned using a lithography mask. In alternative embodiments, the protection layers 103 and 203 include a nitride such as silicon nitride, an oxide such as silicon oxide, phosphosilicate glass (PSG), borosilicate glass (BSG), boron-doped phosphosilicate glass (BPSG), a combination thereof, or the like. The protection layers 103 and 203 may be formed by a suitable fabrication technique such as spin-coating, chemical vapor deposition (CVD), plasma-enhanced chemical vapor deposition (PECVD) or the like.

Referring to FIG. 1B, the semiconductor dies 100 and 200 are encapsulated with an encapsulation layer E. In some embodiments, the encapsulation layer E includes a molding compound, such as an epoxy, a resin, a moldable polymer, a combination thereof, or the like. The molding compound may be applied while substantially liquid, and then may be cured through a chemical reaction, such as in an epoxy or resin. In other embodiments, the molding compound may be an ultraviolet (UV) or thermally cured polymer applied as a gel or malleable solid capable of being disposed around and between the semiconductor dies 100 and 200. The encapsulation layer E and the semiconductor dies 100 and 200 are planaraized, such that backsides of the semiconductor dies 100 and 200 are substantially level or coplanar with the topmost surface of the encapsulation layer E. In some embodiments, the encapsulation layer E may be planaraized using a CMP process, a grinding process, an etching process, a combination thereof, or the like. In some embodiments, the encapsulation layer E has a Coefficient of Thermal Expansion (CTE) of about 10 ppm/° C. or higher.

Thereafter, a redistribution layer structure RDL is then formed on the encapsulation layer E and the semiconductor dies 100 and 200. Specifically, the redistribution layer structure RDL is formed over the front sides of the semiconductor dies 100 and 200. The redistribution layer structure RDL is referred to as a "front side redistribution layer structure" in some examples. The redistribution layer structure RDL includes polymer layers PM and conductive features MF embedded by the polymer layers PM. In some embodiments, each of the metal features MF includes Cu, W, Ni, Sn, Ti, Au, an alloy or a combination thereof, and may be formed by a plating process. In some embodiments, each of the polymer layers PM includes polybenzoxazole (PBO), polyimide (PI), benzocyclobutene (BCB), a combination thereof, or the like. In some embodiments, the method of forming the redistribution layer structure RDL includes performing multiple damascene processes. In alternative embodiments, the method of forming the redistribution layer structure RDL includes performing deposition, photolithography, plating, and photoresist stripping processes.

Referring to FIG. 1C, the carrier C is debonded from the backsides of the semiconductor dies 100 and 200. In some embodiments, the debonding layer DB is decomposed under heat of light, and the carrier C is then released from the structure formed thereon. In some embodiments, a singulation process is then performed to separate adjacent semiconductor packages 10 from each other. In some embodiments, the DAF on the backside of each of the semiconductor dies 100 and 200 is simultaneously removed during the debonding operation. In some embodiments, the semiconductor package 10 includes the semiconductor dies 100 and 200, the encapsulation layer E around the semiconductor dies 100 and 200, and the redistribution layer structure RDL over the semiconductor dies 100 and 200 and the encapsulation layer E.

Figure 1D:
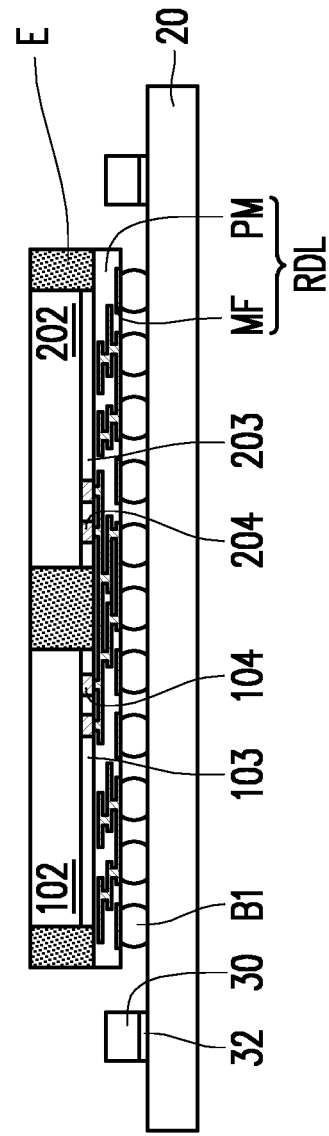

Referring to FIG. 1D, a first package substrate 20 is provided. In some embodiments, the first package substrate 20 is a board substrate including a core layer and two build-up layers on the opposite sides of the core layer. In some embodiments, the core layer includes prepreg (which contains epoxy, resin, and/or glass fiber), polyimide, photo image dielectric (PID), a combination thereof, or the like. In some embodiments, each of the build-up layers includes dielectric layers and conductive patterns alternately stacked. In some embodiments, each of the dielectric layers includes prepreg (which contains epoxy, resin, and/or glass fiber), polyimide, polybenzoxazole (PBO), benzocyclobutene (BCB), a nitride such as silicon nitride, an oxide such as silicon oxide, phosphosilicate glass (PSG), borosilicate glass (BSG), boron-doped phosphosilicate glass (BPSG), a combination thereof, or the like. In some embodiments, each of the conductive patterns includes metal, such as Al, Ti, Cu, Ni, W, and/or an alloy thereof. In some embodiments, the first package substrate 20 is a coreless board substrate for achieving a smaller package profile.

In some embodiments, the first package substrate 20 is an interposer substrate including a redistribution layer structure disposed on a semiconductor substrate. In some embodiments, through substrate vias may extend through the semiconductor substrate and are electrically connected to the conductive features of the redistribution layer structure. In some embodiments, bumps are disposed on the redistribution layer structure to provide electrical connectors for bonding to various components. In some embodiments, in order to achieve a smaller package profile, the semiconductor substrate of the interposer structure may be thinned or removed during manufacturing, and thus, a silicon-substrate-free (Si-less) or silicon-free interposer structure is provided.

Thereafter, the semiconductor package 10 is bonded to and electrically connected to the first package substrate 20 through a plurality of first bumps B1. In some embodiments, the first bumps B1 for bonding are formed on the redistribution layer structure RDL. In alternative embodiments, the bumps B for bonding are formed on the first package substrate 20. In some embodiments, the first bumps B1 include copper, solder, nickel or a combination thereof. In some embodiments, the bumps B may be solder balls, controlled collapse chip connection (C4) bumps, ball grid array (BGA) balls, micro bumps, electroless nickel-electroless palladium-immersion gold technique (ENEPIG) formed bumps, copper pillar, hybrid bonding bumps, or the like.

In some embodiments, one or more surface devices 30 may be optionally connected to the first package substrate 20. The surface devices 30 may be used to provide additional functionality or programming to the semiconductor package 10, or the package as a whole. In some embodiments, the surface devices 30 may include surface mount devices (SMDs) or integrated passive devices (IPDs) that include passive devices such as resistors, inductors, capacitors, jumpers, combinations of these, or the like that are desired to be connected to and utilized in conjunction with the semiconductor package 10, or other parts of the package. The surface devices 30 may be placed on the first package substrate 20 at the same side of the semiconductor package 10. In some embodiments, two surface devices 30 are bonded to the first package substrate 20 at two sides of the semiconductor package 10 through an adhesive layer 32. In some embodiments, the adhesive layer 32 includes any suitable adhesive, such as epoxy, DAF, silver paste or the like.

Figure 1E:
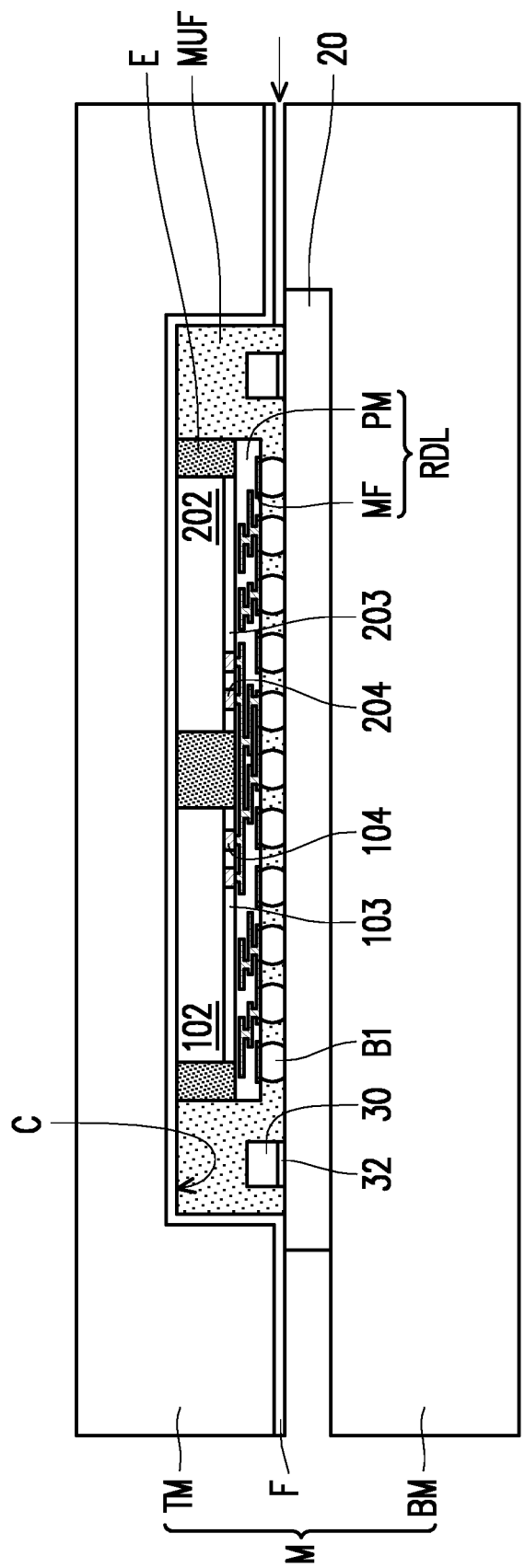
Figure 1F:
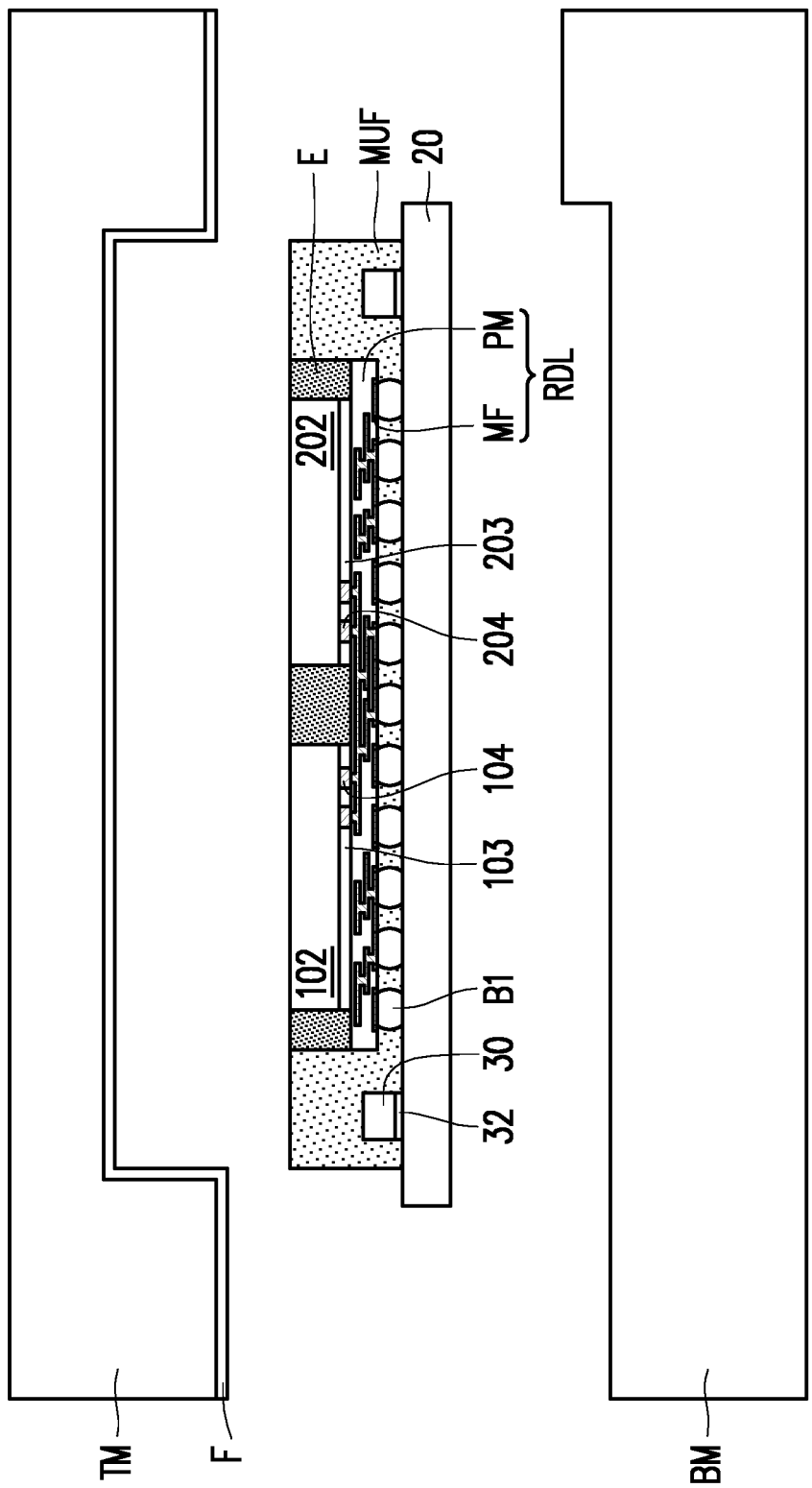

Referring to FIG. 1E and FIG. 1F, a molded underfill layer MUF is formed by a molding process. In some embodiments, a mold M including a top mold TM and a bottom mold BM is provided. The top mold TM and the bottom mold BM are detachably engaged. A cavity C is provided by the top mold TM, and a release film F is formed along the surface of the cavity C. The shape of the cavity C corresponds to the shape of the subsequently molded underfill layer MUF.

As shown in FIG. 1E, the structure including the semiconductor package 10 and the underlying first package substrate 20 is placed in the mold M. Thereafter, an underfill material flows into the cavity C along the arrow direction. In some embodiments, the underfill material includes a molding compound, such as an epoxy, a resin, a moldable polymer, a combination thereof, or the like. The molding compound may be applied while substantially liquid, and then may be cured through a chemical reaction, such as in an epoxy or resin. In other embodiments, the molding compound may be an ultraviolet (UV) or thermally cured polymer applied as a gel or malleable solid capable of being disposed around and between the bottom mold BM and the top mold TM. In some embodiments, the molded underfill layer MUF has a CTE of about 15 ppm/° C. or higher, such as 20-30 ppm/° C.

In some embodiments, the CTE of the molded underfill layer MUF is greater than the CTE of the encapsulation layer E of the semiconductor package 10, so as to reduce the CTE mismatch between the layers in the package. In some embodiments, the CTE of the silicon substrate of each of the semiconductor dies 100 and 200 is about 3 ppm/° C. and the encapsulation layer E aside the semiconductor dies 100 and 200 is about 10 ppm/° C., while the first package substrate 20 has a high CTE, which may be significantly greater than 10 ppm/° C. Accordingly, increasing the CTE of the molded underfill layer MUF is beneficial to reduce the CTE mismatch between the semiconductor package 10 and the first package substrate 20 and therefore improve the warpage profile of the resulting 3DIC structure.

In some embodiments, the CTE of the molded underfill layer MUF is at least 1.5 times the CTE of the encapsulation layer E of the semiconductor package 10. In some embodiments, the CTE of the molded underfill layer MUF is 2 times, 2.5 times or 3 times the CTE of the encapsulation layer E of the semiconductor package 10.

In some embodiments, the molded underfill layer MUF and the encapsulation layer E include similar material but exhibit different CTE. In alternative embodiments, the molded underfill layer MUF and the encapsulation layer E include different materials.

The molded underfill layer MUF is formed to fill up the cavity C of the mold M. In some embodiments, the molded underfill layer M is formed to surround the first bumps B1, the sidewall of the semiconductor package 10, and the sidewall and top of each of the surface devices 30. In some embodiments, the molded underfill layer MUF has a substantially planar top surface and a substantially vertical sidewall. In some embodiments, the top surface of the molded underfill layer MUF is coplanar with the backsides of the semiconductor dies 100 and 200 of the semiconductor package 10.

Thereafter, the 3DIC structure including the semiconductor package 10, the first package substrate 20 and the molded underfill layer MUF is then released from the mold M, as shown in FIG. 1F. The release film F on the top mold TM is configured to provide good releasability of the molded underfill layer MUF.

Figure 1G:
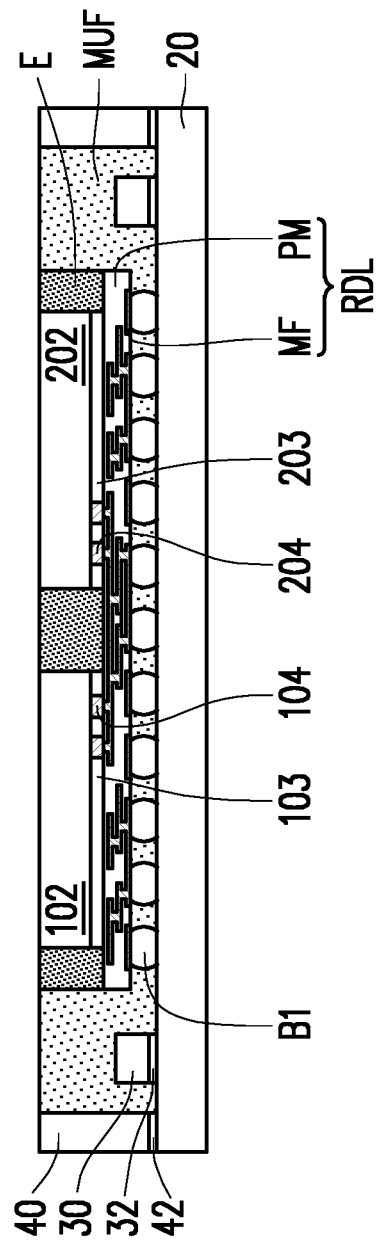

Referring to FIG. 1G, a ring component 40 is optionally mounted on the first package substrate 20. The ring component 40 is configured to not only reduce the package warpage but also increase the heat dissipation. In some embodiments, the ring component 40 may be formed from a material with high thermal conductivity, such as steel, stainless steel, copper, the like, or combinations thereof. In some embodiments, the ring component 40 is coated with another metal, such as gold, nickel, or the like. In some embodiments, the ring component 40 is a single contiguous material. In some embodiments, the ring component 40 includes multiple pieces that may be the same or different materials.

The ring component 40 is adhered to the first package substrate 20 through an adhesive layer 42. In some embodiments, the adhesive layer 42 may include epoxy, glue, or the like, and may be a thermally conductive material. In some embodiments, the adhesive layer 42 may be a polymeric material, solder paste, indium solder paste, or the like.

In some embodiments, the ring component 40 is in physical contact with the encapsulation layer E, and the top surface thereof is substantially coplanar with the top surface of the encapsulation layer E. However, the disclosure is not limited thereto. In alternative embodiments, the ring component 40 is separated from the encapsulation layer E by a distance. In yet alternative embodiments, the top surface of the ring component 40 is not as level as (e.g., higher than) the top surface of the encapsulation layer E.

In some embodiments, the adhesive layer 42 for adhesion and thermal conduction is formed on the first package substrate 20. In alternative embodiments, the adhesive layer 42 for adhesion and thermal conduction is formed on the ring component 40.

Figure 1H:
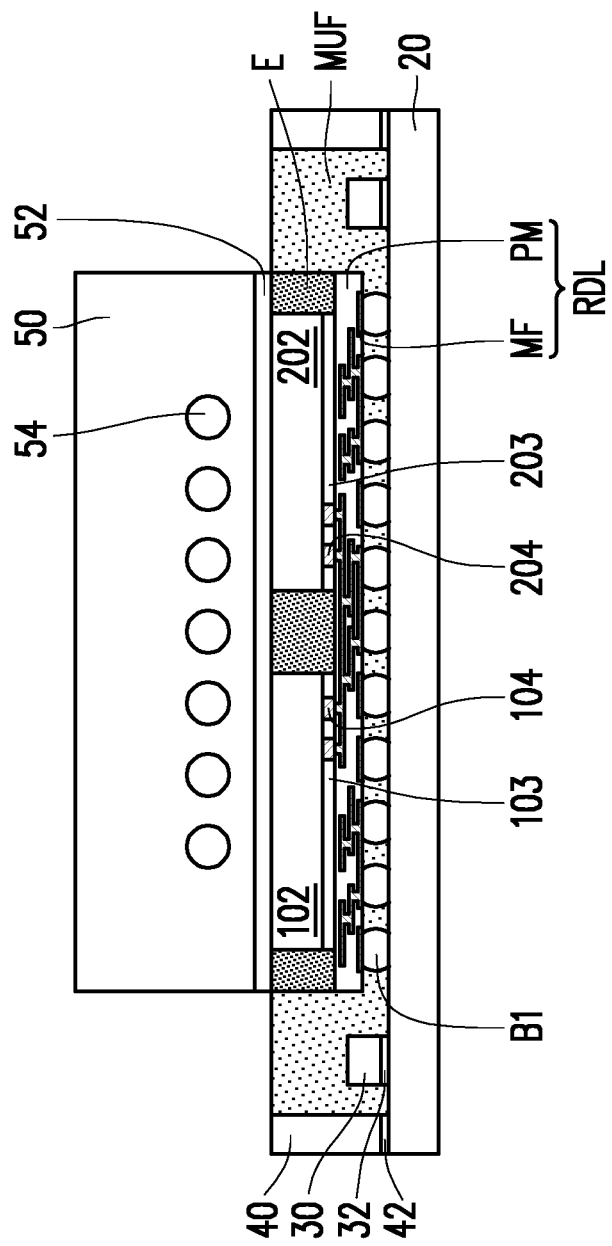

Referring to FIG. 1H, a heat spreader 50 is mounted on the semiconductor package 10. In some embodiments, the heat spreader 50 may be formed from a material with high thermal conductivity, such as steel, stainless steel, copper, the like, or combinations thereof. In some embodiments, the heat spreader 50 is coated with another metal, such as gold, nickel, or the like. In some embodiments, the heat spreader 50 is a single contiguous material. In some embodiments, the heat spreader 50 includes multiple pieces that may be the same or different materials. In some embodiments, the heat spreader 50 is a cold plate with a plurality of cold pipes 54 therein. In some embodiments, the cold pipes 54 may be arranged at an equal interval across the semiconductor dies 100 and 200. In alternative embodiments, the cold pipes 54 may be arranged according to the hot spot of the semiconductor dies 100 and 200. For example, the cold pipes 54 are arranged near the hot spot, so as to dissipate heat more effectively.

The heat spreader 50 is adhered to the semiconductor package 10 through a thermal interface material (TIM) 52. In some embodiments, the TIM 52 is in physical contact with the backsides of the semiconductor dies 100 and 200 and the encapsulation layer E. In some embodiments, the TIM 52 may include epoxy, glue, or the like, and may be a thermally conductive material. In some embodiments, the TIM 52 may be a polymeric material, solder paste, indium solder paste, or the like. The material of the TIM 52 may be the same or different from the material of the adhesive layer 42.

In some embodiments, the TIM 52 for adhesion and thermal conduction is formed on the heat spreader 50. In alternative embodiments, the TIM 52 for adhesion and thermal conduction is formed on the semiconductor package 10.

In some embodiments, the edge of the heat spreader 50 is substantially aligned with the edge or the semiconductor package 10. However, the present disclosure is not limited thereto. In alternative embodiments, the heat spreader 50 may be wider than the semiconductor package 10. For example, the heat spreader 50 further covers a portion of the molded underfill layer MUF, so as to further improve the heat dissipation. In yet alternative embodiments, the heat spreader 50 may be narrower than the semiconductor package 10 as needed.

Figure 1I:
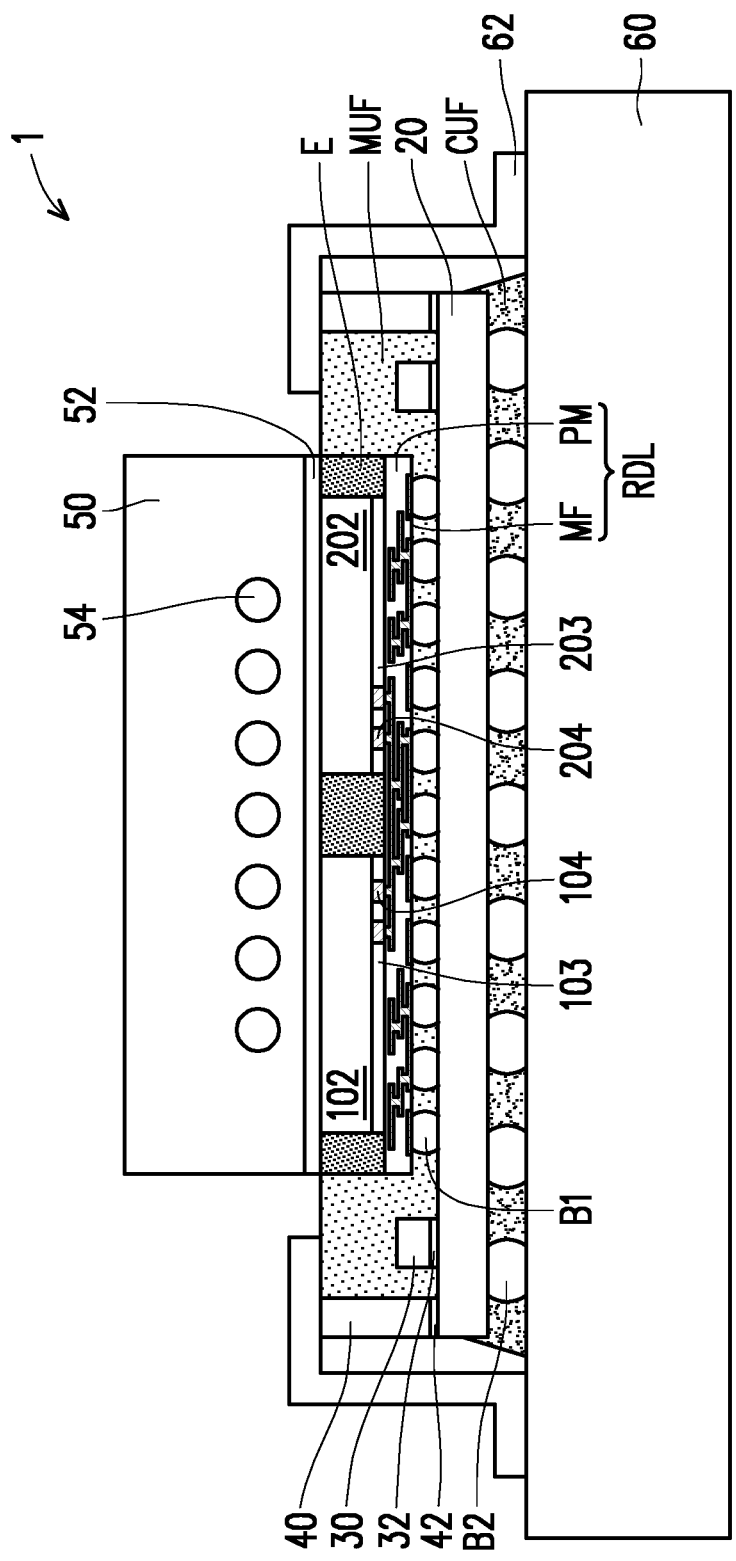

Referring to FIG. 1I, a second package substrate 60 is provided. In some embodiments, the second package substrate 60 is a board substrate including a core layer and two build-up layers on the opposite sides of the core layer. In some embodiments, the core layer includes prepreg (which contains epoxy, resin, and/or glass fiber), polyimide, photo image dielectric (PID), a combination thereof, or the like. In some embodiments, each of the build-up layers includes dielectric layers and conductive patterns alternately stacked. In some embodiments, each of the dielectric layers includes prepreg (which contains epoxy, resin, and/or glass fiber), polyimide, polybenzoxazole (PBO), benzocyclobutene (BCB), a nitride such as silicon nitride, an oxide such as silicon oxide, phosphosilicate glass (PSG), borosilicate glass (BSG), boron-doped phosphosilicate glass (BPSG), a combination thereof, or the like. In some embodiments, each of the conductive patterns includes metal, such as Al, Ti, Cu, Ni, W, and/or an alloy thereof. In some embodiments, the second package substrate 60 is a coreless board substrate for achieving a smaller package profile.

In some embodiments, the second package substrate 60 is an interposer substrate including a redistribution layer structure disposed on a semiconductor substrate. In some embodiments, through substrate vias may extend through the semiconductor substrate and are electrically connected to the conductive features of the redistribution layer structure. In some embodiments, bumps are disposed on the redistribution layer structure to provide electrical connectors for bonding to various components. In some embodiments, in order to achieve a smaller package profile, the semiconductor substrate of the interposer structure may be thinned or removed during manufacturing, and thus, a silicon-substrate-free (Si-less) or silicon-free interposer structure is provided.

Thereafter, the structure including the semiconductor package 10, the first package substrate 20, the molded underfill layer MUF and the heat spreader 50 is bonded on a second package substrate 60 through a plurality of second bumps B2. In some embodiments, the second bumps B2 for bonding are formed on the first package substrate 20. In alternative embodiments, the second bumps B2 for bonding are formed on the second package substrate 60. In some embodiments, the second bumps B2 include copper, solder, nickel or a combination thereof. In some embodiments, the bumps B may be solder balls, controlled collapse chip connection (C4) bumps, ball grid array (BGA) balls, micro bumps, electroless nickel-electroless palladium-immersion gold technique (ENEPIG) formed bumps, copper pillar, hybrid bonding bumps, or the like. In some embodiments, the dimension of the second bumps B2 is greater than (e.g., at least 2 times) the dimension of the first bumps B1.

Thereafter, a capillary underfill layer CUF is formed by a dispensing process. Specifically, an underfill material is dispensed along one edge of the second bumps B2, and the underfill material is drawn under the first package substrate 20 by capillary action until it completely fills the gaps between the first package substrate 20 and the second package substrate 60. In some embodiments, the capillary underfill layer CUF is formed to surround the second bumps B2 and creep onto a portion of the sidewall of the first package substrate 20.

In some embodiments, the underfill material includes a molding compound, such as an epoxy, a resin, a moldable polymer, a combination thereof, or the like. The molding compound may be applied while substantially liquid, and then may be cured through a chemical reaction, such as in an epoxy or resin. In other embodiments, the molding compound may be an ultraviolet (UV) or thermally cured polymer applied as a gel or malleable solid capable of being disposed around and between the bottom mold BM and the top mold TM. In some embodiments, the capillary underfill layer CUF has a CTE of about 10 ppm/° C. or higher. In some embodiments, the CTE of the capillary underfill layer CUF is less than the CTE of the molded underfill layer MUF.

In some embodiments, the capillary underfill layer CUF and the molded underfill layer MUF include similar material but exhibit different CTE. In alternative embodiments, the capillary underfill layer CUF and the molded underfill layer MUF include different materials.

In some embodiments, a clamp component 62 is further provided to clamp the semiconductor package 10 to the second package substrate 60. Specifically, the clamp component 62 is mounted on the molded underfill layer MUF of the semiconductor package 10 for detachably holding the semiconductor package 10 on the second package substrate 60. In some embodiments, the clamp component 62 is in physical contact with the molded underfill layer MUF and the ring component 40 while is separated from the capillary underfill layer CUF. A 3DIC structure 1 of the disclosure is thus completed.

Figure 2:
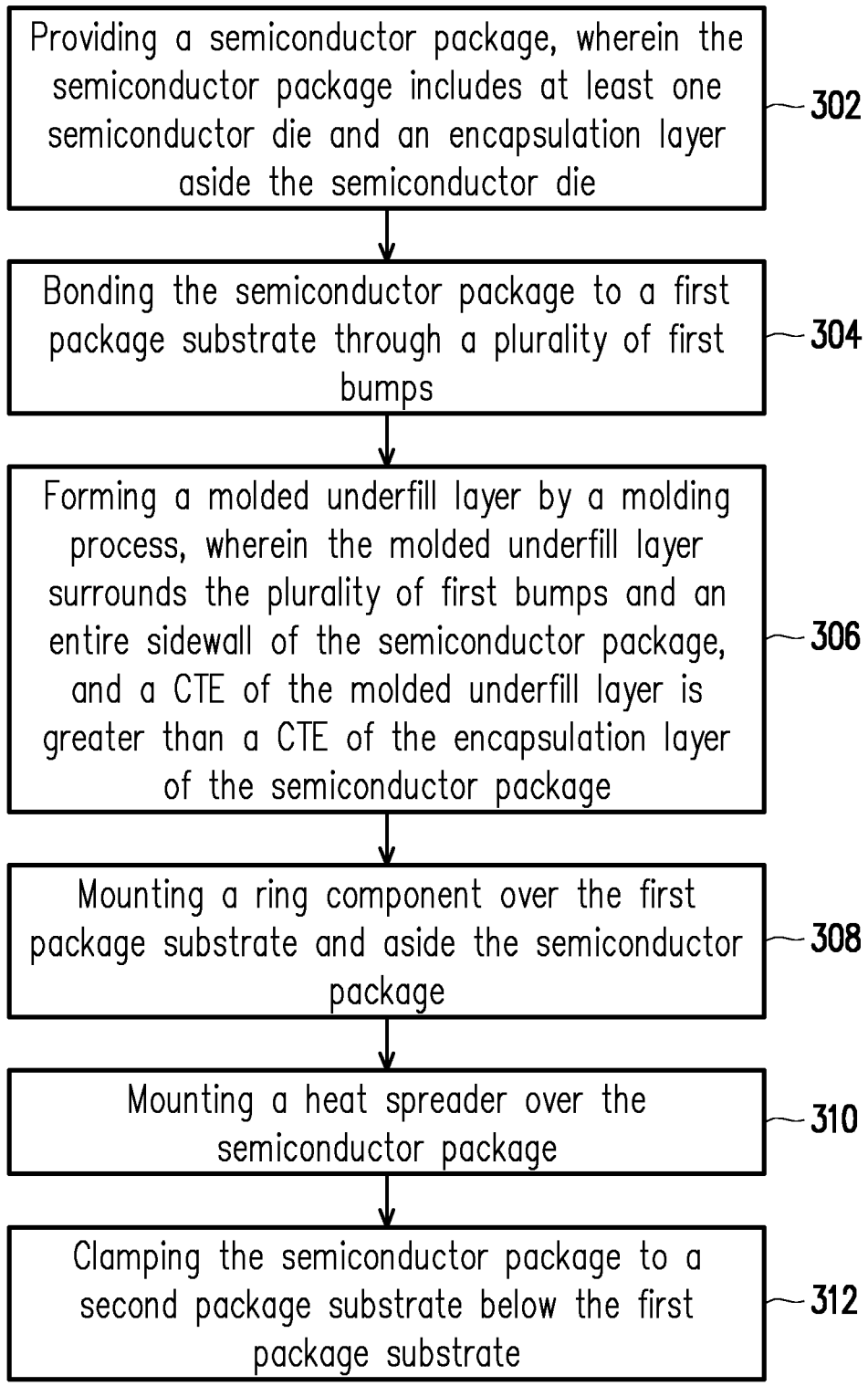
FIG. 2 illustrates a method of forming a 3DIC structure in accordance with some embodiments.

FIG. 2 illustrates a method of forming a 3DIC structure in accordance with some embodiments. Although the method is illustrated and/or described as a series of acts or events, it will be appreciated that the method is not limited to the illustrated ordering or acts. Thus, in some embodiments, the acts may be carried out in different orders than illustrated, and/or may be carried out concurrently. Further, in some embodiments, the illustrated acts or events may be subdivided into multiple acts or events, which may be carried out at separate times or concurrently with other acts or sub-acts.

In some embodiments, some illustrated acts or events may be omitted, and other un-illustrated acts or events may be included.

At act 302, a semiconductor package is provided, wherein the semiconductor package includes at least one semiconductor die and an encapsulation layer aside the semiconductor die. FIG. 1A to FIG. 1C illustrate cross-sectional views corresponding to some embodiments of act 302.

At act 304, the semiconductor package is bonded to a first package substrate through a plurality of first bumps. FIG. 1D illustrates a cross-sectional view corresponding to some embodiments of act 304.

At act 306, a molded underfill layer is formed by a molding process, wherein the molded underfill layer surrounds the plurality of first bumps and an entire sidewall of the semiconductor package, and a CTE of the molded underfill layer is greater than a CTE of the encapsulation layer of the semiconductor package. FIG. 1E to FIG. 1F illustrate cross-sectional views corresponding to some embodiments of act 306.

At act 308, a ring component is mounted over the first package substrate and aside the semiconductor package. FIG. 1G illustrates a cross-sectional view corresponding to some embodiments of act 308.

At act 310, a heat spreader is mounted over the semiconductor package. FIG. 1H illustrates a cross-sectional view corresponding to some embodiments of act 310.

At act 312, the semiconductor package is clamped to a second package substrate below the first package substrate. In some embodiments, the first package substrate is bonded to second package substrate through a plurality of second bumps. FIG. 1I illustrates a cross-sectional view corresponding to some embodiments of act 312.

The 3DIC structure of FIG. 1I may be modified upon the process requirements. FIG. 3 to FIG. 9 are cross-sectional views of various 3DIC structures in accordance with some embodiments. The difference between them is described in details below, and the similarity is not iterated herein.

Figure 3:
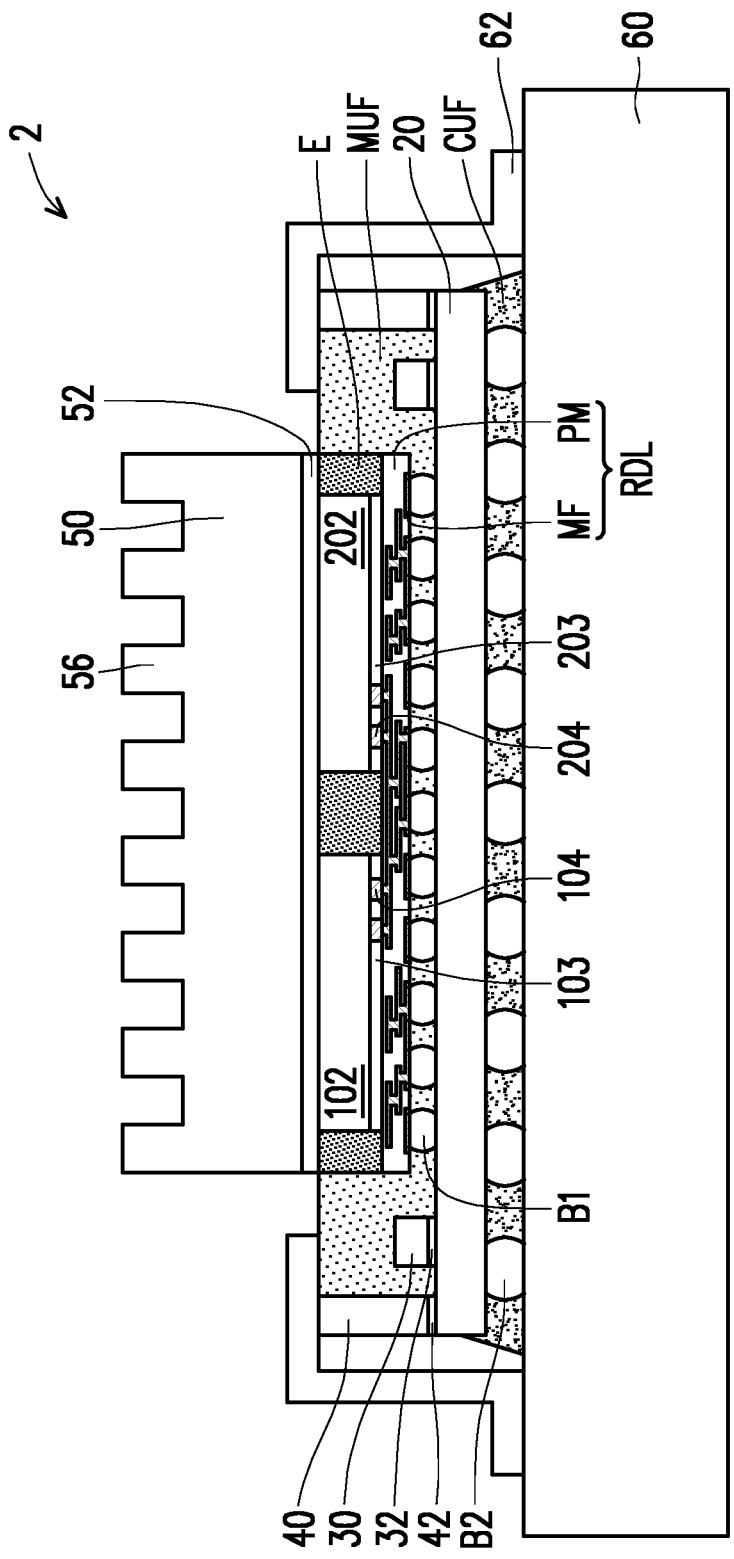
FIG. 3 to FIG. 9 are cross-sectional views of various 3DIC structures in accordance with some embodiments.

The 3DIC structure 2 of FIG. 3 is similar to the 3DIC structure 1 of FIG. 1I, and the difference between them lies in that, the heat spreader 50 of FIG. 3 is a fin-type heat sink while the heat spreader 50 of FIG. 1 is a cold plate. In some embodiments, the fin-type heat sink has a plurality of fins 56 extending from the top surface thereof. In some embodiments, the fins 56 may be arranged at an equal interval across the semiconductor dies 100 and 200. In alternative embodiments, the fins 56 may be arranged according to the hot spot of the semiconductor dies 100 and 200. For example, the fins 56 are arranged near the hot spot, so as to dissipate heat more effectively.

Figure 4:
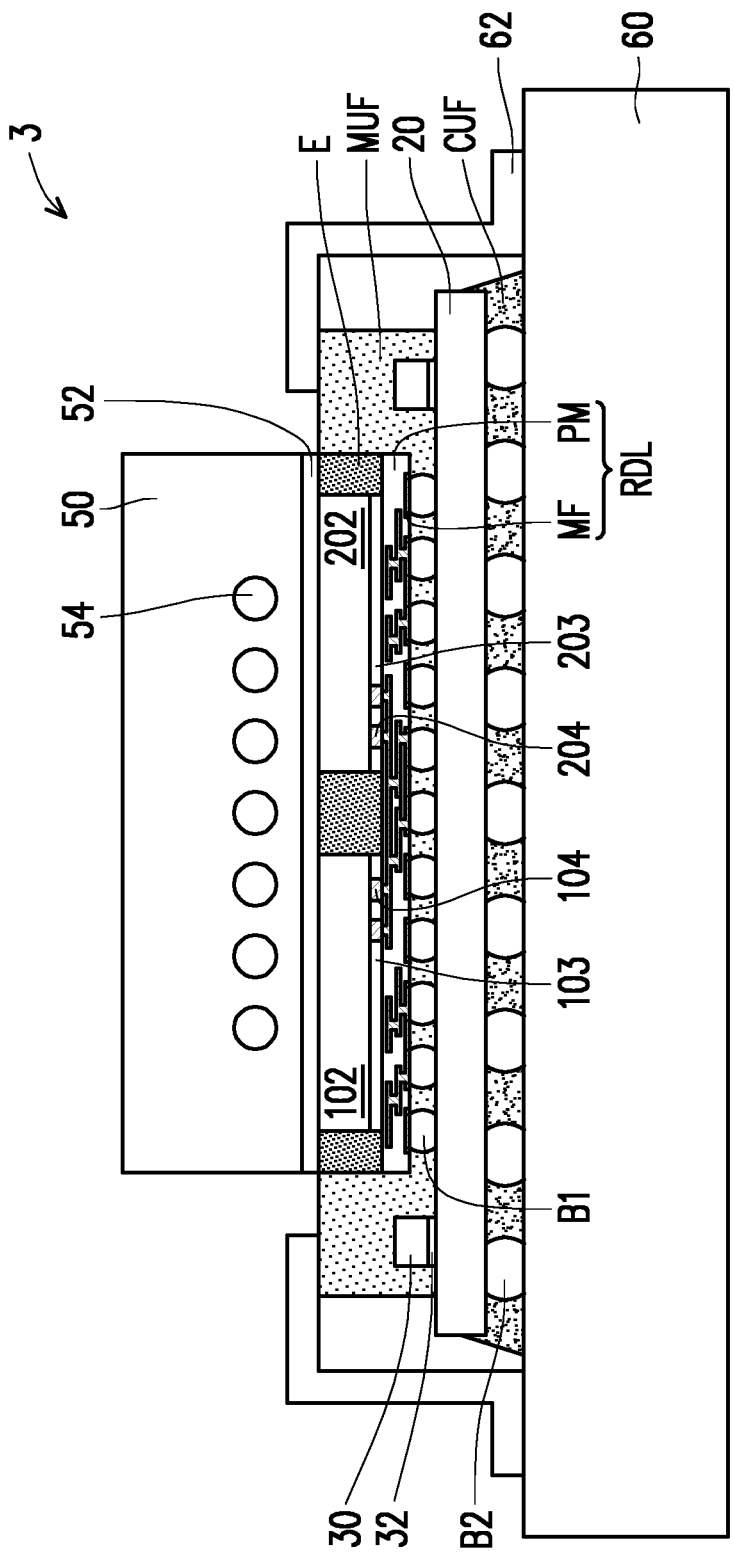

The 3DIC structure 3 of FIG. 4 is similar to the 3DIC structure 1 of FIG. 1I, and the difference between them lies in that, the ring component 40 is provided for the 3DIC structure 1 of FIG. 1I but is optionally omitted from the 3DIC structure 3 of FIG. 4.

Figure 5:
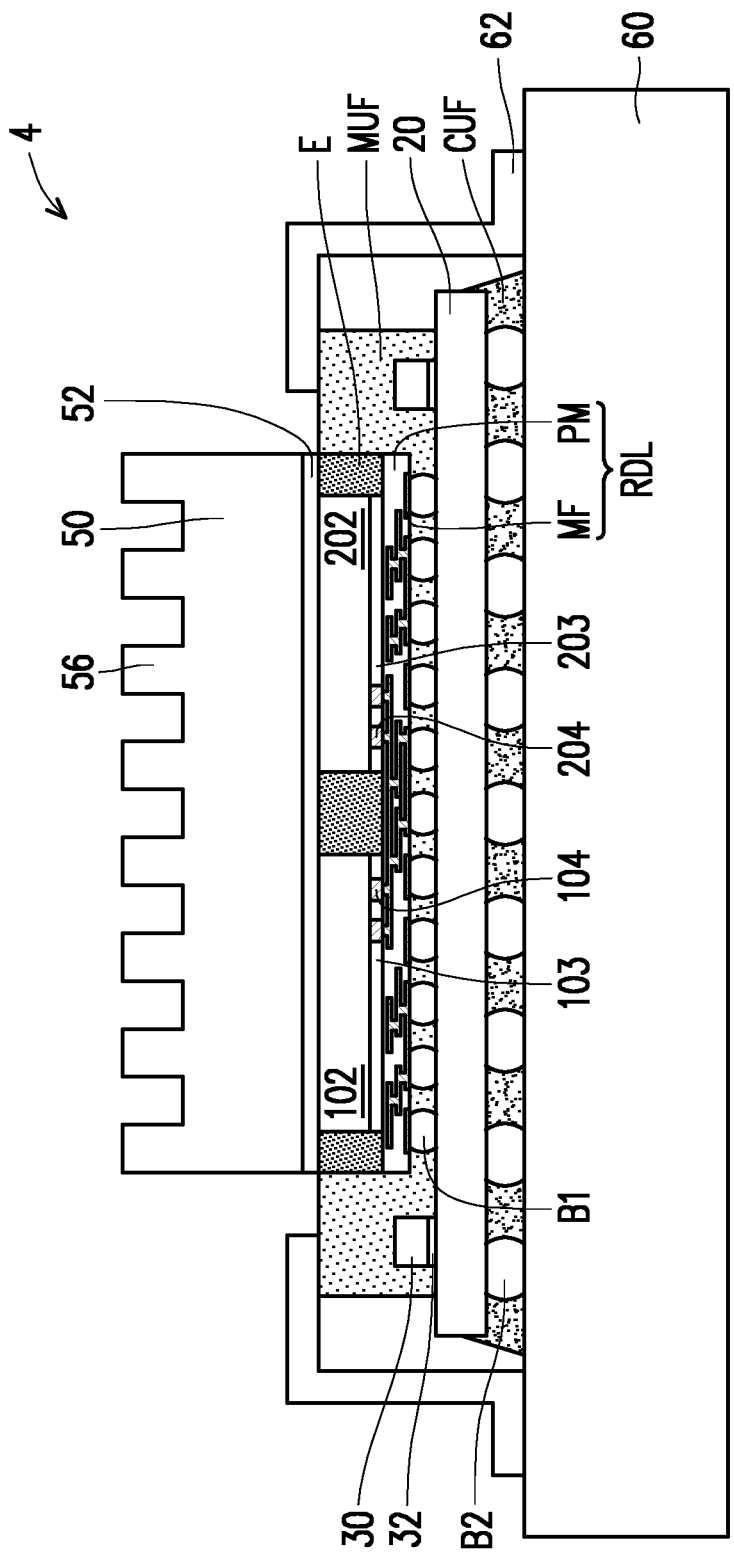

The 3DIC structure 4 of FIG. 5 is similar to the 3DIC structure 2 of FIG. 3, and the difference between them lies in that, the ring component 40 is provided for the 3DIC structure 2 of FIG. 3 but is optionally omitted from the 3DIC structure 4 of FIG. 5.

Figure 6:
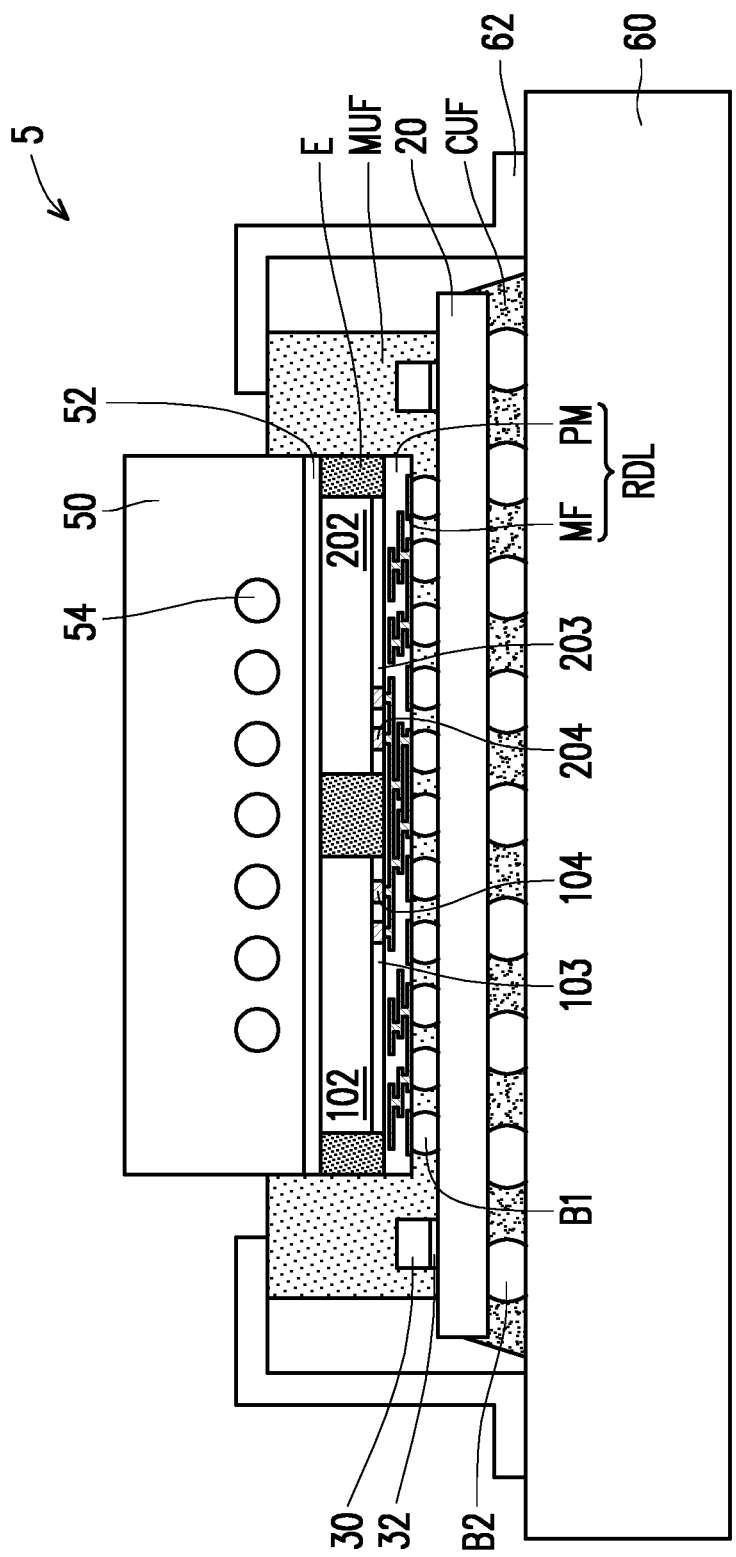

The 3DIC structure 5 of FIG. 6 is similar to the 3DIC structure 3 of FIG. 4, and the difference between them lies in that, the molded underfill layer MUF of FIG. 4 is substantially coplanar with the backsides of the semiconductor dies 100 and 200, while the molded underfill layer MUF of FIG. 6 is higher than the backsides of the semiconductor dies 100 and 200. In some embodiments, the ring component 40 is optionally provided for the 3DIC structure 5 of FIG. 6.

Figure 7:
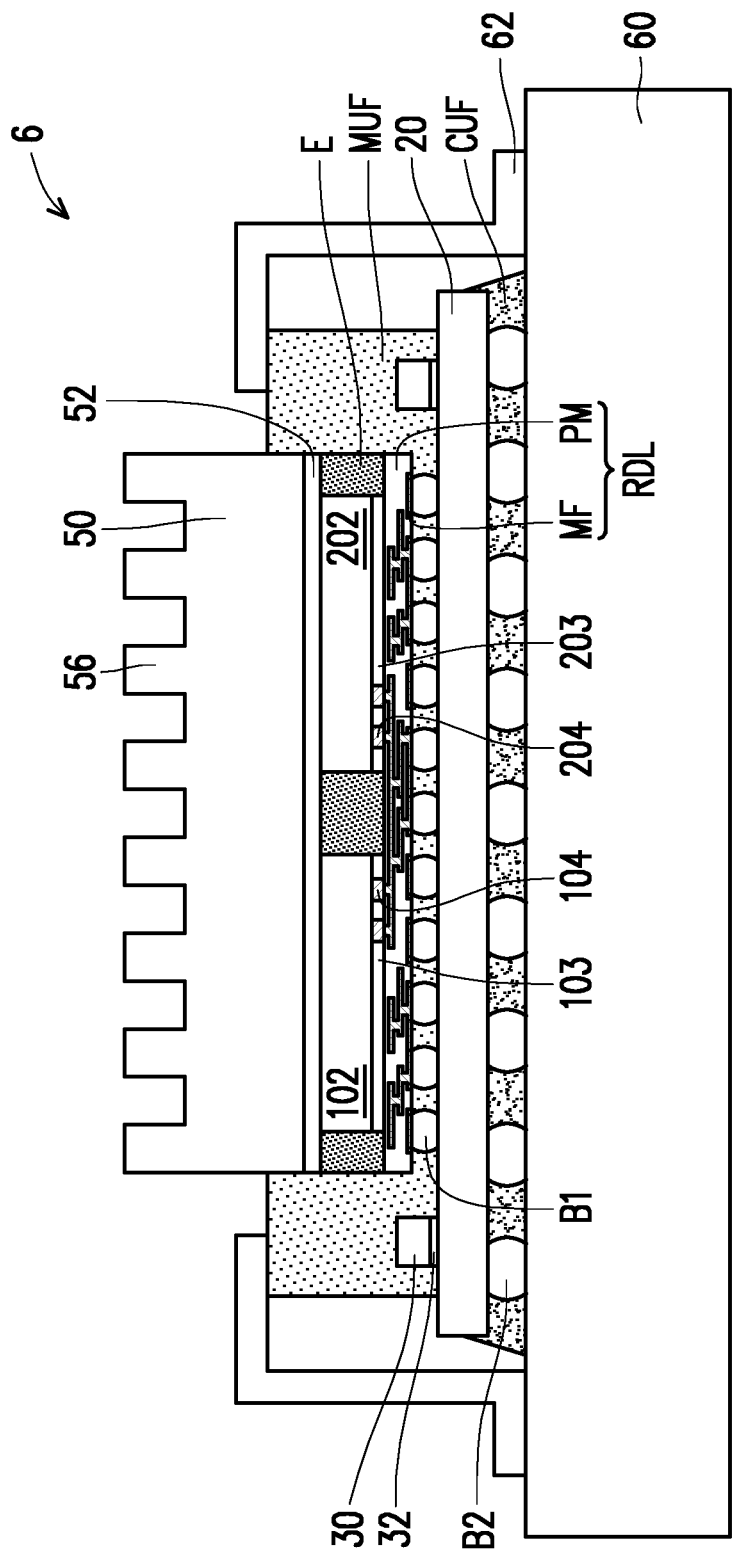

The 3DIC structure 6 of FIG. 7 is similar to the 3DIC structure 4 of FIG. 5, and the difference between them lies in that, the molded underfill layer MUF of FIG. 5 is substantially coplanar with the backsides of the semiconductor dies 100 and 200, while the molded underfill layer MUF of FIG. 7 is higher than the backsides of the semiconductor dies 100 and 200. In some embodiments, the ring component 40 is optionally provided for the 3DIC structure 6 of FIG. 7.

Figure 8:
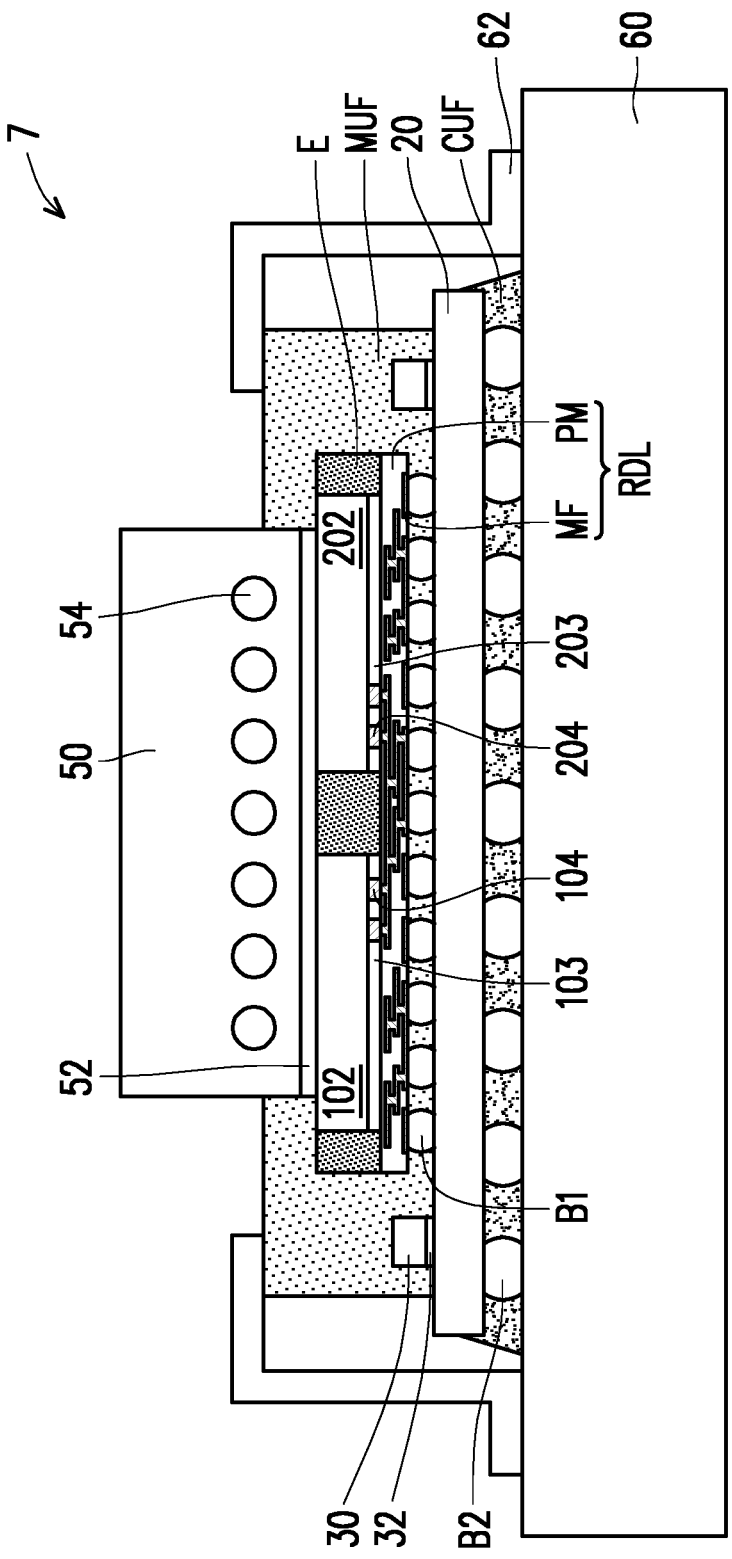

The 3DIC structure 7 of FIG. 8 is similar to the 3DIC structure 5 of FIG. 6, and the difference between them lies in that, the molded underfill layer MUF of FIG. 8 further extends onto a portion of the backside of each of the semiconductor dies 100 and 200. In some embodiments, the ring component 40 is optionally provided for the 3DIC structure 7 of FIG. 8.

Figure 9:
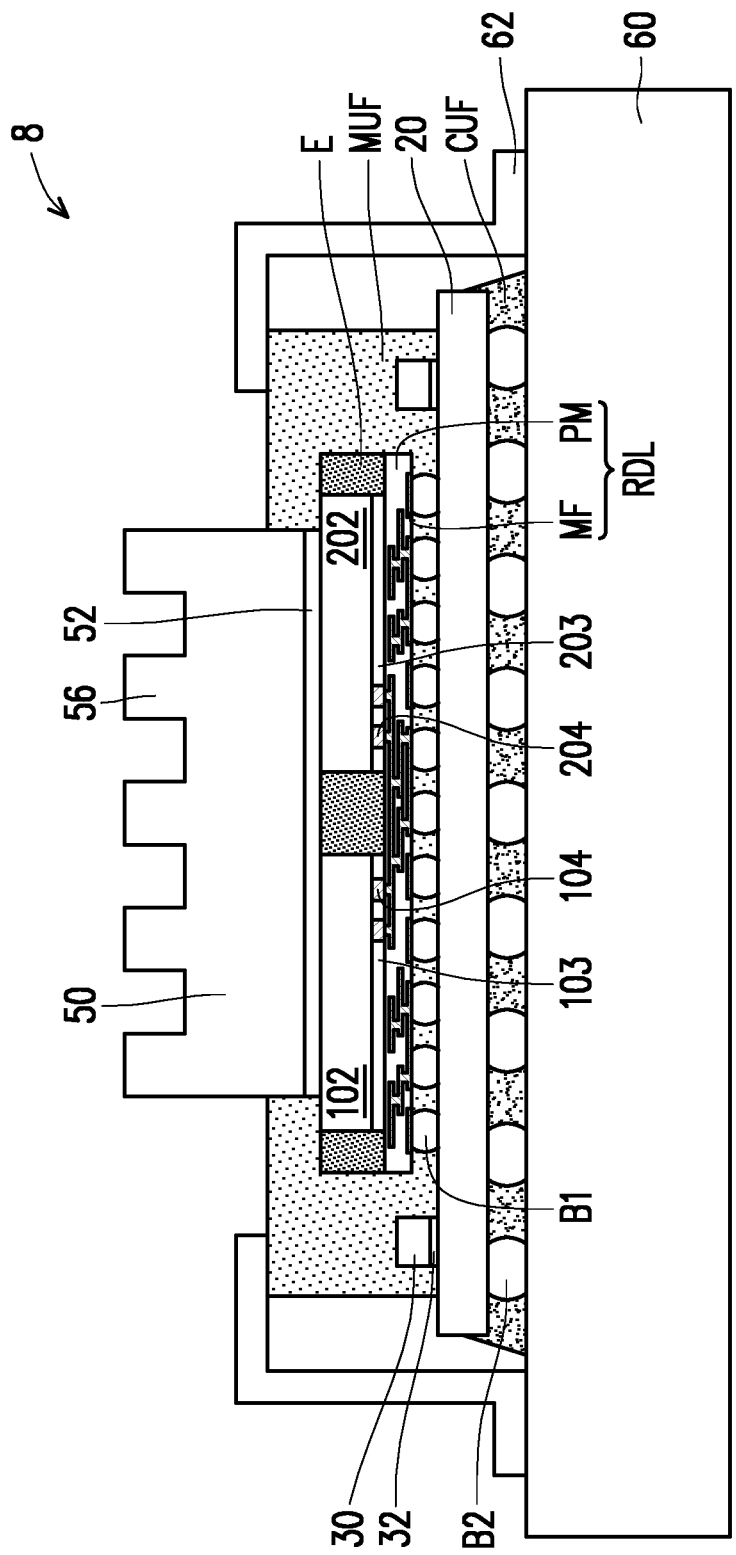

The 3DIC structure 8 of FIG. 9 is similar to the 3DIC structure 6 of FIG. 7, and the difference between them lies in that, the molded underfill layer MUF of FIG. 9 further extends onto a portion of the backside of each of the semiconductor dies 100 and 200. In some embodiments, the ring component 40 is optionally provided for the 3DIC structure 8 of FIG. 9.

The 3DIC structure of the disclosure and its modifications will be described below with reference to the cross-sectional views of FIG. 1I and FIG. 3 to FIG. 9.

In accordance with some embodiments of the present disclosure, as shown in FIG. 1I and FIG. 3 to FIG. 9, a 3DIC structure 1/2/3/4/5/6/7/8 includes a semiconductor package 10, a package substrate 20, a molded underfill layer MUF and a thermal interface material 52. The semiconductor package 10 is disposed over and electrically connected to the first package substrate 20 through a plurality of first bumps B1. The semiconductor package 10 includes semiconductor dies 100 and 200 and an encapsulation layer E aside the semiconductor dies 100 and 200. The molded underfill layer MUF surrounds the plurality of first bumps B1 and a sidewall of the semiconductor package 10, and has a substantially planar top surface. The CTE of the molded underfill layer MUF is different from the CTE of the encapsulation layer E of the semiconductor package 10. The thermal interface material 52 is disposed over the semiconductor package 10.

In some embodiments, each of the semiconductor dies 100 and 200 has a first side (e.g., front side) close to the first package substrate 20 and a second side (e.g., backside) away from the first package substrate 20. In some embodiments, the top surface of the molded underfill layer MUF is substantially coplanar with the second side of the semiconductor die 100 or 200, as shown in FIG. 1I and FIG. 3. In some embodiments, the top surface of the molded underfill layer MUF is higher than the second side of the semiconductor die 100 or 200, as shown in FIG. 4 to FIG. 7. In some embodiments, the molded underfill layer MUF further covers a portion of the second side of the semiconductor die 100 or 200, as shown in FIG. 6 to FIG. 7. The shape of the molded underfill layer MUF may be changed as needed by adjusting the cavity shape of the mold M during the molding process.

In some embodiments, the molded underfill layer MUF exposes a portion of the first package substrate 20, as shown in FIG. 1I, FIG. 3 to FIG. 9. In some embodiments, the 3DIC structure ½ further includes a ring component 40 surrounding the semiconductor package 10 and located on the exposed portion of the first package substrate 20, as shown in FIG. 1I and FIG. 3.

In some embodiments, the molded underfill layer MUF further encapsulates at least one surface device 30 (e.g., passive device) aside the semiconductor package 10, as shown in FIG. 1I, FIG. 3 to FIG. 9. The molded underfill layer MUF covers the top and sidewall of the surface device 30.

In some embodiments, as shown in FIG. 1I and FIG. 3 to FIG. 9, the semiconductor package 10 further includes a redistribution layer structure RDL disposed between the first package substrate 20 and the semiconductor die 100 or 200. In some embodiments, the CTE of the molded underfill layer MUF is greater than the CTE of the encapsulation layer E. However, the disclosure is not limited thereto. In alternative embodiments, the CTE of the molded underfill layer MUF is less than the CTE of the encapsulation layer E. The CTE of the molded underfill layer MUF and the CTE of the encapsulation layer E may be adjusted until the warpage profile of the resulting 3DIC structure is improved.

In some embodiments, the 3DIC structure 1/3/5/7 further includes a cold plate disposed over the thermal interface material 52, as shown in FIG. 1I and FIG. 4, FIG. 6 and FIG. 8. In some embodiments, the 3DIC structure 2/4/6/8 further includes a fin-type heat sink disposed over the thermal interface material 52 as shown in FIG. 3, FIG. 5, FIG. 7 and FIG. 9. In some embodiments, the dimension of the cold plate or fin-type heat sink is substantially the same as the dimension of the semiconductor package 10, as shown in FIG. 1I, FIG. 3 to FIG. 7. In alternative embodiments, the dimension of the cold plate or fin-type heat sink is smaller than the dimension of the semiconductor package 10, as shown in FIG. 8 to FIG. 9. In some embodiments, the cold plate or fin-type heat sink covers the semiconductor die 10 and the encapsulation layer E.

In accordance with some embodiments of the present disclosure, as shown in FIG. 1I and FIG. 3 to FIG. 9, a 3DIC structure 1/2/3/4/5/6/7/8 includes a semiconductor package 10, a first package substrate 20, a surface device 30 (e.g., passive device), a molded underfill layer MUF and a clamp component 62. The semiconductor package 10 is disposed over and electrically connected to the first package substrate 20, wherein the semiconductor package 10 includes at least one semiconductor die 100 having a first side (e.g., front side) close to the first package substrate 20 and a second side (e.g., backside) away from the first package substrate 20. The surface device 30 is disposed over and electrically connected to the first package substrate 20 and located aside the semiconductor package 10. The molded underfill layer MUF is disposed aside the semiconductor package 10 and the surface device 30 and has a top surface not lower than the second side of the semiconductor die 100. In some embodiments, the molded underfill layer MUF has a substantially planar top surface and a substantially vertical sidewall. The clamp component 62 is configured to clamp the semiconductor package 10 to a second package substrate 60 below the first package substrate 20. The dimension of the second package substrate 60 is greater than the dimension of the first package substrate 20.

In some embodiments, the semiconductor package 10 is bonded to the first package substrate 20 through a plurality of first bumps B1, the first package substrate 20 is bonded to the second package substrate 60 through a plurality of second bumps B2, and the dimension of the plurality of first bumps B1 is less than the dimension of the plurality of second bumps B2.

In some embodiments, the 3DIC structure 1/2/3/4/5/6/7/8 further includes a capillary underfill layer CUF surrounding the plurality of second bumps B2, as shown in FIG. 1I and FIG. 3 to FIG. 9. The capillary underfill layer CUF has an inclined sidewall.

In view of the above, in the 3DIC structure of the disclosure, the CTE mismatch between a semiconductor package and the underlying package substrate is resolved by changing (e.g., increasing) the CTE of the molded underfill layer around the semiconductor package. Accordingly, the warpage profile of the resulting 3DIC structure can be improved.

In accordance with some embodiments of the present disclosure, a 3DIC structure includes a semiconductor package, a first package substrate, a molded underfill layer and a thermal interface material. The semiconductor package is disposed over and electrically connected to the first package substrate through a plurality of first bumps. The semiconductor package includes at least one semiconductor die and an encapsulation layer aside the semiconductor die. The molded underfill layer surrounds the plurality of first bumps and a sidewall of the semiconductor package, and has a substantially planar top surface. The CTE of the molded underfill layer is different from the CTE of the encapsulation layer of the semiconductor package. The thermal interface material is disposed over the semiconductor package.

In accordance with alternative embodiments of the present disclosure, a 3DIC structure includes a semiconductor package, a first package substrate, a passive device, a molded underfill layer and a clamp component. The semiconductor package is disposed over and electrically connected to the first package substrate, wherein the semiconductor package includes at least one semiconductor die having a first side close to the first package substrate and a second side away from the first package substrate. The passive device is disposed over and electrically connected to the first package substrate and located aside the semiconductor package. The molded underfill layer is disposed aside the semiconductor package and the passive device and has a top surface not lower than the second side of the semiconductor die. The clamp component is configured to clamp the semiconductor package to a second package substrate below the first package substrate.

In accordance with yet alternative embodiments of the present disclosure, a method of forming a three-dimensional integrated circuit (3DIC) structure includes the following operations. A semiconductor package is provided, wherein the semiconductor package includes at least one semiconductor die and an encapsulation layer aside the semiconductor die. The semiconductor package is bonded to a first package substrate through a plurality of first bumps. A molded underfill layer is formed by a molding process, wherein the molded underfill layer surrounds the plurality of first bumps and an entire sidewall of the semiconductor package, and a CTE of the molded underfill layer is greater than a CTE of the encapsulation layer of the semiconductor package.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A three-dimensional integrated circuit (3DIC) structure, comprising:
   a semiconductor package, comprising at least one semiconductor die and an encapsulation layer aside the semiconductor die;
   a molded underfill layer, surrounding a sidewall of the semiconductor package, wherein a top surface of the molded underfill layer is flushed with a top surface of the encapsulation layer, and a coefficient of thermal expansion of the molded underfill layer is greater than a coefficient of thermal expansion of the encapsulation layer of the semiconductor package, and
   a ring component surrounding the semiconductor package.

2. The 3DIC structure of claim 1, further comprising a thermal interface material disposed over the semiconductor package and in contact with the encapsulation layer.

3. The 3DIC structure of claim 2, further comprising a cold plate or a fin-type heat sink disposed over the thermal interface material.

4. The 3DIC structure of claim 1, wherein the ring component is in contact with the semiconductor package.

5. The 3DIC structure of claim 1, further comprising a first package substrate disposed below and electrically connected to the semiconductor package, wherein the molded underfill layer exposes a portion of the first package substrate.

6. The 3DIC structure of claim 5, wherein the semiconductor package further comprises a redistribution layer structure disposed between the semiconductor die and the first package substrate.

7. The 3DIC structure of claim 5, wherein the first package substrate is bonded to an underlying second package substrate through a plurality of bumps, and a capillary underfill layer surrounds the plurality of bumps.

8. The 3DIC structure of claim 1, further comprising passive devices disposed at two sides of the semiconductor package.

9. The 3DIC structure of claim 8, wherein the molded underfill layer further encapsulates the passive devices.

10. The 3DIC structure of claim 1, wherein the coefficient of thermal expansion of the molded underfill layer is at least 1.5 times the coefficient of thermal expansion of the encapsulation layer.

11. A three-dimensional integrated circuit (3DIC) structure, comprising:
    a semiconductor package, disposed over and electrically connected to a first package substrate through a plurality of first bumps, wherein the semiconductor package comprises semiconductor dies and an encapsulation layer aside and between the semiconductor dies;
    a molded underfill layer, surrounding the plurality of first bumps and a sidewall of the semiconductor package; and
    a thermal interface material, overlying the semiconductor dies and the encapsulation layer, wherein the thermal interface material is in contact with the molded underfill layer,
    wherein the 3DIC structure further comprises a clamp component configured to clamp the semiconductor package to a second package substrate below the first package substrate.

12. The 3DIC structure of claim 11, further comprising a heat spreader disposed on the thermal interface material, wherein the molded underfill layer further covers a portion of a side surface of the heat spreader.

13. The 3DIC structure of claim 12, wherein the heat spreader is a cold plate with a plurality of cold pipes therein, and the cold pipes are arranged near a hot spot of the semiconductor package.

14. The 3DIC structure of claim 11, wherein a surface of the molded underfill layer is higher than a surface of the encapsulation layer.

15. The 3DIC structure of claim 11, further comprising passive devices disposed at two sides of the semiconductor package.

16. A three-dimensional integrated circuit (3DIC) structure, comprising:
    a semiconductor package, disposed over and electrically connected to a first package substrate through a plurality of first bumps, wherein the semiconductor package comprises semiconductor dies and an encapsulation layer aside and between the semiconductor dies;
    a molded underfill layer, surrounding the plurality of first bumps and a sidewall of the semiconductor package;
    a thermal interface material, disposed on the semiconductor package; and
    a passive device, disposed in the molded underfill layer, wherein a coefficient of thermal expansion of the molded underfill layer is different from a coefficient of thermal expansion of the encapsulation layer of the semiconductor package.

17. The 3DIC structure of claim 16, wherein a surface of the molded underfill layer is higher than a surface of the encapsulation layer.

18. The 3DIC structure of claim 16, wherein a surface of the molded underfill layer is flush with a surface of the encapsulation layer.

19. The 3DIC structure of claim 16, wherein the coefficient of thermal expansion of the molded underfill layer is greater than the coefficient of thermal expansion of the encapsulation layer of the semiconductor package.

20. The 3DIC structure of claim 16, further comprising a ring component surrounding the semiconductor package.

* * * * *